United States Patent [19]

Hokynar

[11] Patent Number: 4,760,244

[45] Date of Patent: Jul. 26, 1988

[54] APPARATUS FOR THE TREATMENT OF SEMICONDUCTOR MATERIALS

[76] Inventor: Jiri Hokynar, Kaethe-Kollwitz-Strasse 3a, 8033 Martinsried, Fed. Rep. of Germany

[21] Appl. No.: 929,285

[22] Filed: Nov. 12, 1986

[30] Foreign Application Priority Data

Nov. 11, 1985 [DE] Fed. Rep. of Germany ....... 3539981

[51] Int. Cl.$^4$ .............................................. H05B 3/62
[52] U.S. Cl. .................................... 219/390; 118/729; 118/733; 118/724; 219/411
[58] Field of Search ............... 219/390, 405, 411, 354, 219/388; 118/724, 725, 728, 729, 733, 50.1

[56] References Cited

U.S. PATENT DOCUMENTS

| | | | |
|---|---|---|---|
| 2,981,819 | 4/1961 | Gregory | 219/405 |
| 3,862,397 | 1/1975 | Anderson | 219/405 |
| 4,167,915 | 9/1979 | Toole | 219/390 |
| 4,347,431 | 8/1982 | Pearce | 219/390 |
| 4,375,027 | 2/1983 | Zeto | 219/390 |
| 4,545,327 | 10/1985 | Campbell | 118/724 |
| 4,573,431 | 3/1986 | Sarkozy | 118/733 |

FOREIGN PATENT DOCUMENTS 56-137795 10/1981 Japan .................................... 118/724

Primary Examiner—E. A. Goldberg
Assistant Examiner—Teresa Walberg
Attorney, Agent, or Firm—Foley & Lardner, Schwartz, Jeffery, Schwaab, Mack, Blumenthal & Evans

[57] ABSTRACT

A system for the heat treatment and doping of semiconductor wafers or the like has a heating system which can be moved axially over a quartz pipe by means of a linear shifting means, in which quartz pipe the materials to be treated are arranged. The ambient atmosphere is at least partially removed from the quartz pipe in the process, after which the semiconductor wafers are subjected to the desired treatment atmosphere; the heated oven is thereafter moved over the quartz pipe to complete the treatment.

19 Claims, 2 Drawing Sheets

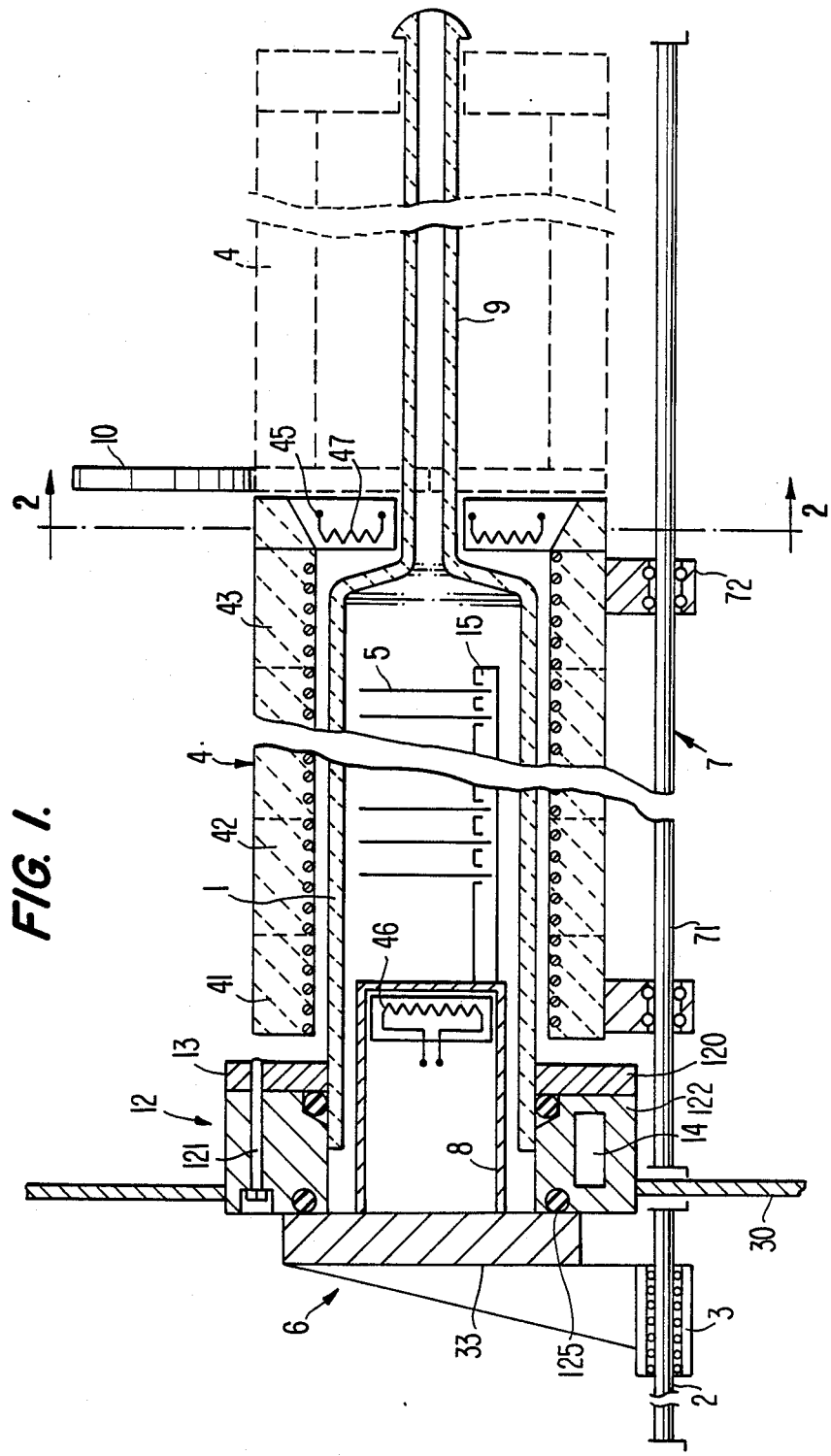

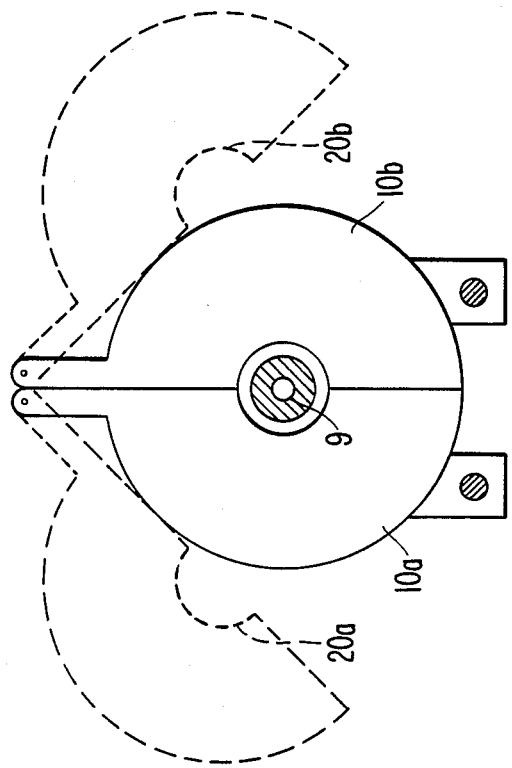

APPARATUS FOR THE TREATMENT OF SEMICONDUCTOR MATERIALS

BACKGROUND OF THE INVENTION

The invention relates to diffusion ovens and to a process for the treatment of semiconductor wafers.

It is known in the art to subject materials such as semiconductor wafers to various treatment processes, such as doping, in quartz pipes. Semiconductor wafers can be doped at high temperatures through contct with an atmosphere containing dopant materials. However, problems exist with this method due to the fact that such treatment must be undertaken with complete avoidance of contamination. In this process, semiconductor wafers must be put into the quartz pipes mechanically, and the semiconductor wafers are always subject to an insufficiently pure atmosphere. In known processes, the semiconductor wafers are put into a hot quartz pipe, which is sealed, and into which the treatment atmosphere is introduced. The preliminary treatment thus ensures in a mixture of laboratory atmosphere and treatment gas, and the semiconductor wafers are subjected to high temperatures from the beginning.

To alleviate disadvantages resulting therefrom, it has been suggested to place a prechamber in front of the quartz pipe (main treatment chamber), and the semiconductor wafers would move through the prechamber to the quartz pipe via a passageway provided with seals. In this system, the problem of mixing atmospheres is somewhat alleviated. However, a new problem results due to the fact that the temperature distribution in the quartz pipe is very nonuniform due to heat radiation coming through the opening of the quartz pipe into the prechamber. This problem is directly related to the inside diameter dimension of the quartz pipe or, correspondingly, to the diameter of the semiconductor wafer to be treated.

SUMMARY OF THE INVENTION

Therefore, an object of the invention is to provide a process and an apparatus for the treatment, and especially the doping treatment, of semiconductor wafers wherein a uniform temperature distribution, as well as a defined atmosphere, is made possible in the treatment.

In accordance with one aspect of the invention, there has been provided an apparatus for the thermal treatment of semiconductor wafers and the like, comprising:

(a) a main treatment chamber with at least one axial opening at a loading end for the loading of material to be treated;

(b) means for loading material to be treated into the main treatment chamber through said axial opening;

(c) heating means surrounding the main treatment chamber by which material to be treated is heated;

(d) closure means for closing said axial opening in the main treatment chamber; and (e) means for linearly moving the heating means onto and off of the main treatment chamber in an axial direction.

In addition, there has been provided a process for treating semiconductor wafers and the like, comprising the steps of:

(a) placing semiconductor wafers into an unheated main treatment chamber;

(b) at least partially removing the existing atmosphere from the main treatment chamber;

(c) subjecting the semiconductor wafers to a treating atmosphere introduced into the main treatment chamber; and (d) moving a heating means around the main treatment chamber so as to heat the semiconductor wafers and effect treatment.

BRIEF DESCRIPTION OF THE DRAWINGS

The invention is described below in more detail by reference to the drawings.

In these:

FIG. 1 represents a partial cross-section through a diffusion oven according to the invention; and FIG. 2 is a sectional view along the line 2—2 of FIG. 1 with retracted heating units.

DETAILED DESCRIPTION OF PREFERRED EMBODIMENTS

In an apparatus according to one embodiment of the invention, materials to be treated, especially semiconductor wafers, are placed into a quartz tube (main treatment chamber) of a diffusion oven in "cold" condition. The quartz tube, which is preferably arranged horizontally within the oven, is shut and the desired atmosphere is produced in the pipe. This can be accomplished, for example, through preliminary evacuation of the existing atmosphere followed by introduction of the treatment atmosphere. Thereafter, a heater is put over the quartz tube and the semiconductor wafers are subjected to even heating. A uniform temperature distribution results, particularly if an additional heating element is arranged in the closing element of the quartz tube, and if the heater put over the quartz tube is also provided with a heatable, insulated closing.

The materials that are preferably treated by this process are semiconductor wafers which are used, for example, in the production of microchips and microcircuits, especially silicon wafers. The main treatment chamber may also comprise heat resistant materials other than quartz. Here, however, the designation of the preferred material, quartz, is used throughout for indicating the material of the main treatment chamber.

Typically, silicon wafers are subjected to temperatures of 400° to 800° C. in depositing or, respectively, tempering processes and to temperatures of 900° to 1300° C. in oxidation or, respectively, diffusion processes in the quartz pipe.

As illustrated in FIG. 1, the diffusion oven in accordance with the invention has a quartz pipe 1 which extends into a preferably coaxial gas supply pipe 9. Semiconductor wafers 5 can be introduced into the quartz pipe on a tray 15. In the embodiment shown in FIG. 1, the tray 15 is rigidly connected with the mount 8 of a closing element 6. The closing element 6 along with mount 8, tray 15, and semiconductor wafers 5 can be moved along a linear positioning means such as, for example, a track 2 on which these means are guided via bearings 3.

If the semiconductor wafers 5 are to be deposited in the quartz pipe 1, known systems can be employed. For instance, the tray 15 could be linearly guided out of the quartz pipe after a rack containing semiconductor wafers 5 is set down in the quartz pipe, while the closing element 6 swings out in front of the quartz pipe and is adjusted to sealably close the quartz pipe.

A heating unit 4 which preferably consists of several heating elements 41, 42, 43 is arranged so as to be linearly adjustable. The heating unit 4 can be moved by means of a mechanical linear adjustment means such as, for example, track 71 and bearing 72, or with wheels. In FIG. 1, the heating element is shown in the condition in which it surrounds the quartz pipe during the treatment. When the quartz pipe 1 is in the "cold" condition, the heating element 4 is retracted as shown by dashed lines in FIG. 1. To avoid exposing the semiconductor wafers to heating when the heating element 4 is in the retracted condition, two shutter elements 10a and 10b, as shown in FIG. 2, are provided. These shutter elements swing down in front of the opening of the heating element 4 in the retracted position to effect a thermal closure of the heating element. These shutter elements 10a and 10b contain notches 20a and 20b, respectively, which surround the gas supply pipe 9 in the closed condition as snugly as possible.

At the rear of the heating element 4, an insulation plate 45 is provided in which a further heating element 47 is arranged. A heating element 46 is also arranged at the free end of the mount 8 in the closing system 6. These additional heating elements provide an especially uniform temperature distribution in the quartz pipe 1.

On the outside of the open end of the quartz pipe 1, a metal closure sleeve assembly 12 is arranged. In the embodiment shown in FIG. 1, this closure sleeve 12 comprises a pressure ring 120 which is fixed to an outer ring 122 with axial screws 121. A first sealing ring 13 disposed between the pressure ring 120 and the outer ring 122 seals the metal closure sleeve assembly 12 against the outside of the quartz pipe. In the outer ring 122, at least one cooling channel 14 is provided in which a cooling fluid can be circulated. In addition, other insulated channels (not shown) through the outer ring 122 are provided for thermoelements, gas supply, and gas removal. The outer ring 122 is attached to a separating wall 30. A second sealing ring 125 is disposed between the metal closure sleeve assembly 12 and the end flange 33 of the closure piece 6. In the embodiment of FIG. 1, a pure (clean) room to the left of the separating wall 30 can be found, while the room to the right of the separating wall requires no special demand for the purity of the atmosphere.

The wafers 5 within the quartz pipe 1 are freed from a contaminated atmosphere in the cold condition, preferably by evacuating the existing atmosphere via evacuation channels (not shown), which run through the closure assembly, especially along the rigid ring 122. Thereafter, the inside of the quartz pipe 1 is filled with the treatment atmosphere via the gas supply pipe 9. The semiconductor wafers are thereby subjected to the treatment atmosphere consistently and evenly in the cold condition.

The segments 10a and 10b on the heating system are then moved apart, the heating system 4 is moved over the quartz pipe 1 linearly in an axial direction, and the semiconductor wafers 5 are then heated in the treatment atmosphere. The doping material contained in the atmosphere is thereby diffused into the semiconductor wafers. The treatment room is filled with the treatment medium evenly and consistently so that all semiconductor wafers 5 are subjected to the same treatment. The temperature distribution is very uniform because of the structure of the diffusion oven.

After the treatment is completed, the heating system 4 is retracted into the position shown by the dashed lines in FIG. 1. The segments 10a and 10b are brought together so as to close off the inside of the heating system 4. The semiconductor wafers are allowed to cool and a pure gas stream is introduced through the gas supply pipe 9. After sufficient cooling of the semiconductor wafers 5, the closure piece 6 is opened and the treated semiconductor wafers can be removed.

What is claimed is:

1. An apparatus for the thermal treatment of semiconductor wafers and the like, comprising:
   (a) a main treatment chamber having a loading end a rear end with at least one axial opening at the loading end for the loading of material to be treated;
   (b) means for loading material to be treated into the main treatment chamber through said axial opening;
   (c) heating means surrounding the main treatment chamber by which material to be treated is heated;
   (d) closure means for closing the axial opening in the main treatment chamber;
   (e) means for linearly moving the heating means onto and off of the main treatment chamber in an axial direction; and
   (f) a gas supply pipe connected to the main treatment chamber for supplying a treatment gas into the main chamber, the gas supply pipe extending axially from the rear end of the main treatment chamber.

2. An apparatus as claimed in claim 1, wherein the main treatment chamber comprises a quartz tube.

3. An apparatus as claimed in claim 1, wherein the heating means comprises a plurality of individually controllable first heating elements.

4. An apparatus as claimed in claim 1, wherein the heating means is cylindrically shaped in an axial direction relative to the main heating chamber with an open end at the front and a closed end at the rear, so as to be able to removably surround the main heating chamber.

5. An apparatus as claimed in claim 4, wherein the closed end of the cylindrical heating means comprises a second heating element.

6. An apparatus as claimed in claim 1, wherein the closure means comprises a mount which, when the closure means is closed, extends into the main treatment chamber and which comprises a third heating element.

7. An apparatus as claimed in claim 1, wherein the main treatment chamber communicates with at least one gas supply pipe.

8. An apparatus as claimed in claim 1, wherein the heating means comprises a movable shutter which may be opened to enable the heating means to surround the main treatment chamber, and which may be closed when the heating means is removed from around the main treatment chamber so as to form a thermal shield for the interior of the heating means.

9. An apparatus as claimed in claim 8, wherein the movable shutter comprises at least two sections which may swing up and down, thereby respectively opening and closing the open end of the heating means.

10. An apparatus as claimed in claim 1, wherein the loading end of the main heating chamber is provided with a closure sleeve assembly comprising at least one sealing ring and at least one coolant channel.

11. An apparatus as claimed in claim 10, wherein the closure sleeve assembly further comprises at least one gas-tight connection conduit.

12. An apparatus as claimed in claim 11, wherein a means for gas withdrawal is provided, said gas withdrawal means being connected to the gas-tight connection conduit.

13. An apparatus as claimed in claim 10, wherein at least a portion of the interior of the closure sleeve assembly is provided with a temperature and chemical resistant coating.

14. An apparatus as claimed in claim 10, wherein at least one coolant channel extends circumferentially within the closure sleeve assembly.

15. An apparatus for the thermal treatment of semiconductor wafers and the like, comprising:
   (a) a main treatment chamber with at least one axial opening at a loading end for the loading of material to be treated;
   (b) means for loading material to be treated into the main treatment chamber through said axial opening;
   (c) heating means for heating said material, said heating means surrounding the main treatment chamber;
   (d) closure means for closing said axial opening in the main treatment chamber, said closure means comprising (i) a closure sleeve sealingly engaged with the main treatment chamber and provided with at least one gas type connection conduit, and (ii) a closure piece being sealingly engaged with said closure sleeve assembly; and
   (e) means for moving the heating means relative to the main treatment chamber such that said heating means surrounds the main treatment chamber.

16. An apparatus in accordance with claim 15, further comprising positioning means for moving materials to be treated into and out of said main treatment chamber.

17. An apparatus in accordance with claim 15, wherein the positioning means for moving material to be treated into and out of said main treatment chamber are connected with said closing element.

18. An apparatus in accordance with claim 15, wherein said closing element comprises a mount 8 which reaches into said main treatment chamber.

19. An apparatus in accordance with claim 18, further comprising a heating element attached to said mount.

* * * * *